United States Patent [19]

Aipperspach et al.

[11] Patent Number: 4,618,943

[45] Date of Patent: Oct. 21, 1986

[54] SEMICONDUCTOR STATIC READ/WRITE MEMORY HAVING AN ADDITIONAL READ-ONLY CAPABILITY

[75] Inventors: Anthony G. Aipperspach; Joseph M. Fitzgerald; Philip T. Wu, all of Rochester, Minn.

[73] Assignee: International Business Machines Corporation, Armonk, N.Y.

[21] Appl. No.: 569,080

[22] Filed: Jan. 9, 1984

[51] Int. Cl.[4] ....................... G11C 11/40; G11C 17/00
[52] U.S. Cl. .................................. 365/104; 365/178; 365/184
[58] Field of Search ............... 365/104, 178, 184, 190, 365/154

[56] References Cited

U.S. PATENT DOCUMENTS 4,006,469  1/1977  Leehan et al. ...................... 365/227
4,434,479  2/1984  Chen et al. .......................... 365/203
4,439,842  3/1984  Malaviya ............................. 365/104

*Primary Examiner*—James W. Moffitt
*Attorney, Agent, or Firm*—J. Michael Anglin

[57] ABSTRACT

A combined read-only and static read/write semiconductor memory is achieved by modifying the normal threshold voltage of some of the transfer FETs in an otherwise conventional static-memory cell. A read/write data bit is recovered from an addressed cell by applying a word-line voltage higher than both the threshold voltages. Read-only data is read from the same addressed cell by using a word-line voltage higher than one of the thresholds but lower than the other, then decoding the resulting bit-line voltages. An extension allows multiple read-only bits in a single cell by lowering the cell supply voltage when read-only data are addressed.

10 Claims, 7 Drawing Figures

SEMICONDUCTOR STATIC READ/WRITE MEMORY HAVING AN ADDITIONAL READ-ONLY CAPABILITY

BACKGROUND OF THE INVENTION

The present invention relates to semiconductor memories, and more specifically relates to a memory unit capable of holding both static read/write data and independently addressable read-only data in a physical chip area no larger than that required for a comparable static read/write memory alone.

Many data-processing and similar applications require both read/write and read-only memory, commonly referred to as RAM and ROM. RAM can be implemented in two forms, static (SRAM) and dynamic (DRAM). DRAM is much more space-efficient, requiring only one FET and a capacitor per bit stored. On the other hand, although conventional SRAM requires six FETs per bit, it does not need the logic overhead and time penalty of refresh circuitry to maintain the data. SRAM is especially advantageous where small or scattered memories are used in a system or even within a single integrated-circuit chip.

Techniques are available in the prior art for combining ROM with either DRAM or SRAM in an area not significantly exceeding that required for the RAM alone. This merged memory, however, has heretofore been of the "latent image" type. That is, the read-only data exists as a controllable geometrical or electrical property of each storage cell which can be converted in place to read/write data in the same cell and then output in the same way that the read/write data are accessed. That is, the read-only data merely replace the read/write data under certain conditions, such as when power is first applied to the memory.

In any of these memories, accessing the read-only data necessitates the destruction of the read/write data in the storage cells. Such a memory may be thought of as being either read/write or read-only, but not both at the same time. For example, a 64K-bit latent-image memory has only 64K addressable locations, and has only a 16-line address bus.

SUMMARY OF THE INVENTION

The present invention, on the other hand, allows stored read-only data to be accessed in a static RAM without destroying any read/write data in the same memory. This is achieved within the same storage-cell size, so the data density of the memory is multiplied by a factor of two or more. For example, a 64K-cell memory according to the invention may have 17 address lines, and interfaces to external devices as a 128K-bit memory having 64K bits of RAM and also 64K bits of ROM. Each of the 128K bits is separately accessible at any time, since each has its own individual address and can be output without altering any other stored bit. Another version provides even higher density, having 18 address lines and containing 128K bits of ROM in the same chip area. The invention also saves power and lowers heat dissipation as well, because the combined SRAM and ROM uses the same amount of power as the SRAM alone.

These and other objects are achieved by modifying the normal threshold voltage of some of the transfer FETs in an otherwise conventional static-memory cell. A read/write data bit is recovered from an addressed cell by applying a word-line voltage higher than both the threshold voltages. Read-only data can be read from the same addressed cell with a word-line voltage higher than one of the thresholds but lower than the other, then decoding the resulting bit-line voltages. An extension allows multiple read-only bits in a single cell by lowering the cell supply voltage when read-only data are addressed.

DETAILED DESCRIPTION

Figure 1:
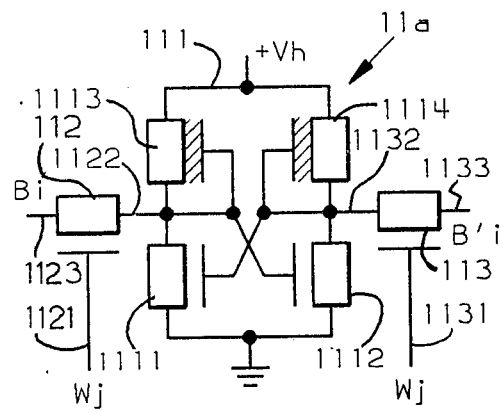
FIGS. 1 and 2 are schematic diagrams of four alternative forms of storage cells according to the present invention.

FIG. 1 shows a single six-device storage cell 11a for a static memory implemented in NMOS technology. A conventional cross-coupled bistable latch 111 holds one bit of read/write data. Latch FETs 1111 and 1112 enhancement-mode devices, while load FETs 1113 and 1114 are depletion-mode devices. Latch 111 is connected between a positive supply voltage Vh and ground. Transfer FET 112 has a gate electrode 1121 connected to an external word line Wj, and source-/drain electrodes 1122 and 1123 (source and drain are physically identical to each other) coupled between one side of latch 111 and an external bit line Bi. Although only one transfer FET is required, cells such as 11a are normally balanced by including another transfer FET 113 having a gate 1131 connected to the same word line Wj and source/drain electrodes 1132 and 1133 coupled between the other side of latch 111 and another external bit line B'i.

In addition to their conventional function of gating a read/write bit into and out of latch 111, during a read/write (RW) mode transfer FETs 112 and 113 store a bit of read-only data, independently of the data in latch 111 during a read-only (RO) mode. This bit is represented by the threshold voltage of the transfer FETs. In cell 11a, the threshold of devices 112 and 113 is about 1.0 volt, or about the same as that of devices 1111 and 1112. That is, device 112 will begin to conduct when gate 1121 is made at least 1.0 volt more positive than source 1122. The fact that both transfer FETs have this 1-volt threshold represents a "1" bit of read-only data.

Figure 2:
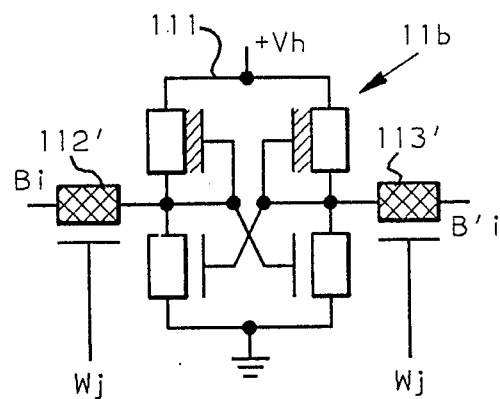

In FIG. 2, storage cell 11b is identical to cell 11a except that both transfer FETs 112' and 113' are fabricated to have a second, higher threshold voltage, typically 5.0 volts. Altering the threshold of an FET can be done by conventional techniques such as ion implantation when the FET channel is formed. The fact that both transfer FETs have a 5-volt threshold represents a "0" bit of read-only data.

If word line Wj is raised to a voltage higher than the higher of the two threshold voltages, say to 8.5 volts, then storage cells 11a and 11b will both read out the read/write data stored in latch 111 during a RW mode. The true form of the data is taken as the voltage passed through transfer FET 112 (or 112') from the precharged bit line Bi; the complement of this data is represented by the voltage passed through transfer FET 113 (or 113') from precharged bit line B'i. That is, cells 11a and 11b are equivalent to each other for word-line voltages above the higher threshold voltage, and the data read out from either cell represents the read/write data stored in latch 111 during a RW mode. However, if word line Wj is raised to a voltage below the higher threshold of devices 112' and 113' but above the lower threshold of devices 112 and 113, then the cell 11a becomes operative and 11b becomes inoperative. Assume a 1-volt threshold for devices 112 and 113, and a 5-volt threshold for 112' and 113'. Raising word line Wj to 4.5 volts reads out cell 11a during a RO mode; the true data bit in latch 111 appears on bit line Bi, and its complement on B'i. But cell 11b now behaves differently than before: neither device 112' nor 113' conducts, so both Bi and B'i are at the precharged level. Cell 11a can thus be decoded as a "1" bit of read-only data, and cell 11b as a "0" bit.

In this way, the conventional six-device static-memory cell can be made to store a read/write bit during a RW mode and a read-only bit during a RO mode without any change in size or geometry, and with only the one additional processing step necessary to alter the threshold of certain ones of the transfer FETs.

Figure 3:
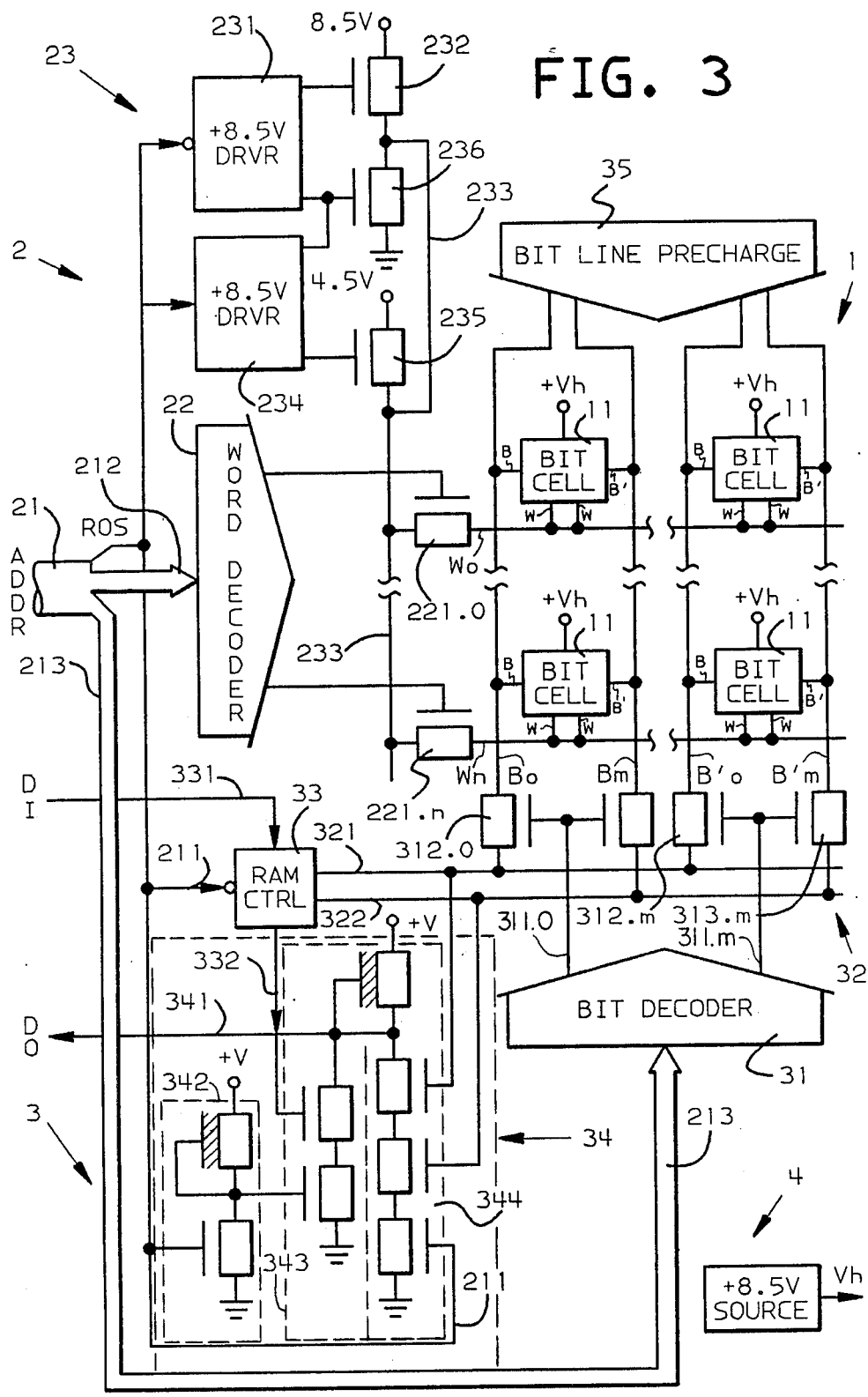
FIG. 3 is a schematic diagram of a complete memory constructed according to the invention.

FIG. 3 illustrates a memory unit patterned after a conventional read/write static memory and modified to allow accessing of data in the RW mode and the RO mode at any time. Reference numeral 1 indicates an array of individual memory cells 11a and 11b, FIGS. 1 and 2. Initially, all cells in array 1 are like cell 11a, and thus represent read-only "1" bits. Wherever a read-only "0" is desired, the thresholds of transfer FETs 112 and 113 are modified by ion implantation or other conventional techniques to form a cell like 11b. Array 1 then comprises a first plurality of cells 11a whose transfer FETs have a first threshold voltage, and a second plurality of cells 11b whose transfer FETs have a different second threshold voltage.

Word selector 2 selects among the cells of array 1, and also chooses either the read/write mode or the read-only mode from the selected cells in response to an externally supplied address on a parallel address bus 21. Assume a memory organization of 131,072 words of 1 bit each (128K×1), so that address bus has 17 lines. Internally, array 1 may be organized as 512 words of 128 cells, each cell holding 2 bits, one read/write and one read-only. One address line serves as a mode control line 211 for selecting the read/write mode if it carries a binary "0" signal and for selecting the read-/only mode if it carries a "1" signal level. Nine address lines 212 cause a conventional binary decoder 22 to turn on one of 512 word-line FETs 221.0–221.n, each having a source connected to a word line W0–Wn.

In conventional practice, the drains of FETs 221.0–221.n would be driven from a constant voltage higher than the threshold voltage of the cell transfer FETs. In the present invention, a switchable source 23 gates one of two different voltages to these FETs, depending upon the state of mode control line 211. When line 211 is "0", it selects the read/write mode in array 1, by causing driver logic 231 to gate +8.5 volts through FET 232 to common line 233. Since this voltage exceeds the threshold of all the transfer FETs in the array, each cell 11 appears to be a conventional static read-/write cell. But, when control line 211 goes high to select the read-only mode from the array, driver logic 231 is disabled, and driver logic 234 is enabled to gate +4.5 volts through FET 235 to line 233. The voltage passed to the selected word line W0–Wn now lies between the the thresholds of the transfer FETs in cells 11a and 11b, as explained in connection with FIGS. 1 and 2. FET 236 discharges common line 233 to ground at certain times during the data-access cycle, as in conventional practice.

Bit selector 3 selects among the bits addressed by word selector 2, outputting one of them to an externally available Data Out line DO, 341. Each word of array 1 has 128 storage cells, only one of which is to be output externally. Conventional binary decoder 31 energizes one of the lines 311.0–311.m in response to the seven address lines 213. FETs 312.0–3.12.m then gate one of the true bit lines B0–Bm onto output rail 321, and FETs 313.0–313.m gate one of the complement bit lines B'0–B'm onto rail 322. If control line 211 is low, conventional RAM control logic 33 converts the differential signals on rails 32 to a binary signal on line 332 representing the bit stored in the latch 111 of the addressed array cell 11. Line 332 actually carries the inverted value of this bit, because it will be inverted again in logic 34. (Logic 33 is also capable of writing a bit from an external Data In line 331 into the addressed cell in the read/write mode. That function is not relevant to the present invention.)

Control logic 34 decodes a read-only data bit from the addressed cell 11 and outputs it to DO line 341 when control line 211 is high. FET inverter 342 passes a low signal to the lower FET of NAND logic gate 343 when line 211 is high, so that the read/write bit on line 332 is decoupled from DO line 341. At the same time, the lowermost FET of NAND logic gate 344 is turned on by the high level on control line 211. The next two FETs turn on only if both of the rails 321 and 322 are high. This condition occurs only if the addressed cell is a cell such as 11b, having high-threshold transfer FETs 112' and 113', because the high voltage placed on the bit lines by conventional precharge circuit 35 at the beginning of each read cycle cannot be discharged to a lower voltage stored in latch 111, FIG. 1. This condition outputs a low level to DO line 341, indicating a "0" read-only bit. If a cell 11a is addressed, one of the rails is high and the other low, depending upon the state of the read/write bit in that cell; whichever rail is high, logic gate 344 has no path to ground, and the high level from the uppermost (depletion-mode) FET outputs a "1" read-only bit to DO line 341.

As can be seen from FIG. 3, control logic 34 passes the value of the read/write bit from the addressed cell to data-out line 341 in the RW mode, i.e., when control line 211 is low ("0"). FET inverter 342 passes a high signal to the lower FET of Nand logic gate 343, so the read/write bit on line 332 is coupled to DO line 341. Since the low level on line 211 turns off the lowermost FET in gate 344, the read-only bit is decoupled from output line 341.

Conventional cell power source 4 supplies a constant +8.5 volt potential to all the cells 11 of array 1.

The memory shown in FIG. 3 has a 128K-bit capacity—64K bits of variable read/write data in the RW mode as well as 64K separately addressable bits of permanent read-only data in the RO mode—in the same physical area as a conventional 64K-bit read/write static memory.

Figure 4:
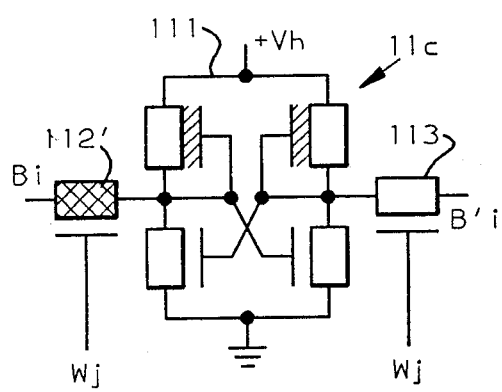
FIGS. 4 and 5 show storage cells useful in another embodiment of the invention.
Figure 5:
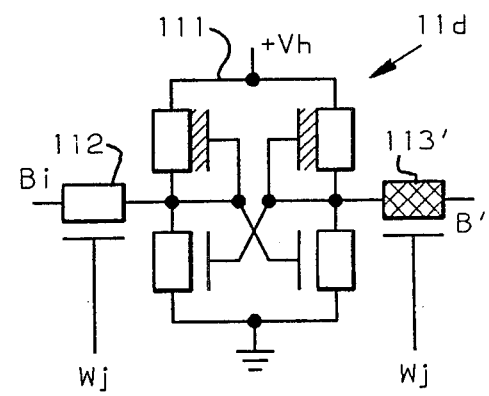
Figure 6:
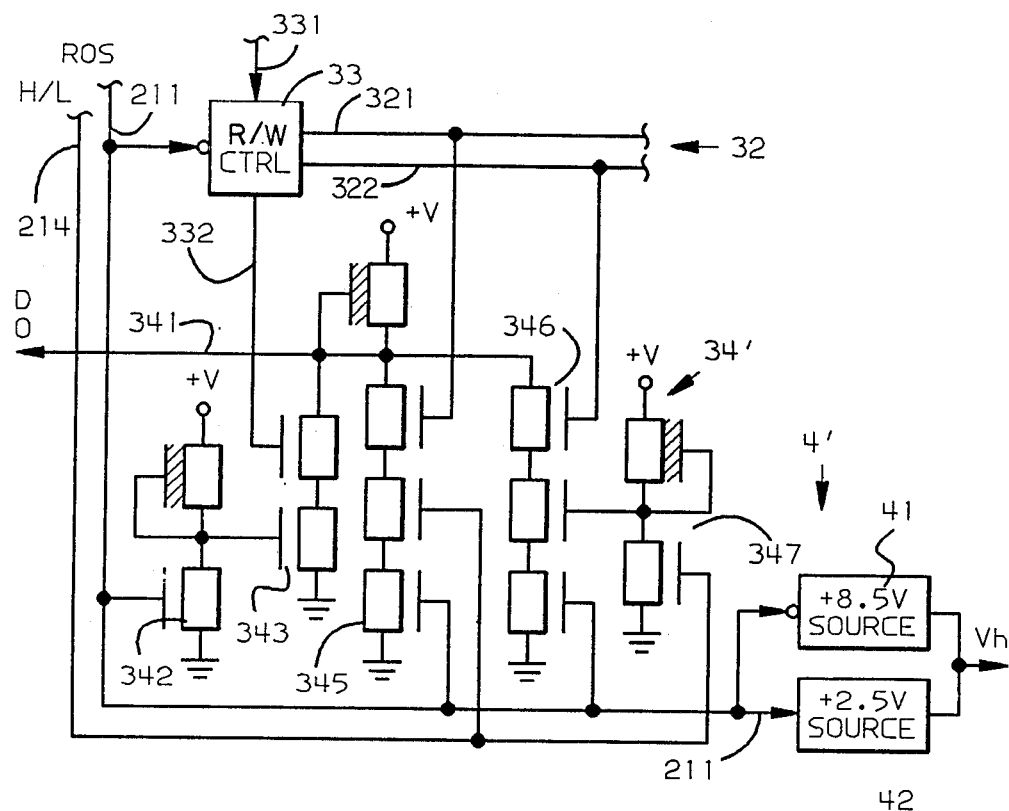
FIG. 6 shows changes to FIG. 3 for a memory according to the other embodiment of the invention.

FIGS. 4–6 illustrate another embodiment of the present invention capable of holding a total of 192K bits—64K bits of read-write data and 128K bits of read-only data—without any increase in physical area. FIG. 4 shows a cell 11c which is identical to cell 11a, FIG. 1, except that the left-hand transfer FET 112' is fabricated to have a high (5.0-volt) threshold, while the right-hand transfer device 113 remains at the normal (1.0-volt) threshold. FIG. 5 details another cell variation 11d which has a normal-threshold left-hand transfer device 112 but a high-threshold right-hand transfer device 113'. Using all four cell variations 11a–11d, FIGS. 1, 2, 4, and 5, in the same memory array allows two read-only bits to be represented.

FIG. 6 shows the changes made to the memory unit of FIG. 3 in order to decode two separate read-only bits in a single addressed cell 11. This involves separate decoding of the two bit lines Bi and B'i of each cell, and varying the Vh supply voltage so as to retain the read/write data therein, yet to prevent it from being passed to either bit line of the cell.

Control line 211 provides an address bit discriminating between read/write and read-only data, as before. An additional control line 214, included as an 18th line in address bus 21 of FIG. 3, indicates whether the high or low read-only bit is to be output to DO line 341 from the addressed cell. Read/write control logic 33 and the inverter 342 and NAND gate 343 of read-only control logic 34 function as previously described. NAND gate 345 is enabled by both the read-only signal level on line 211 and a high-order bit signal level on line 214. When these conditions exist, memory-data output line 341 merely inverts the level of rail 321. NAND gate 346 receives line 211 and the output of inverter 347 from line 214, so as to pass the inverted level of rail 322 to DO line 341 whenever the low-order read-only bit of a cell is addressed.

There remains the problem of preventing the read/write data stored in latch 111 of a cell 11 from overriding the read-only bit signals. This is accomplished by lowering the supply voltage of the latches in all cells whenever the read-only data bits are selected. FIG. 6 replaces the constant supply voltage source 4 with a source 4' having switchable high- and low-voltage sources. Source 41 supplies +8.5 volts to the Vh terminal of every cell in array 1 whenever line 211 is low, indicating that read/write data are desired; the memory unit then operates as described previously. But, when a high level on line 211 selects either of the read-only bits, source 41 is disabled, and a +2.5-volt source 42 is switched into the Vh terminal of the cells.

This lower supply voltage is sufficient to retain the value of the read/write bit stored in latch 111 of each cell, but it is not high enough to pass that bit to the memory output. Referring back to FIG. 5, assume a read-only mode with bit lines Bi and B'i precharged to +8.5 volts, the selected word line at +4.5 volts, and the latch supply voltage cut to +2.5 volts, i.e., below the higher threshold. If cell 11d is addressed, bit line Bi is discharged through device 112 (threshold 1.0 volt) to ground or to +2.5 volts, depending upon the read/write bit stored in latch 111. The supply voltage +V of the logic gates remains fixed at +8.5 volts. Either of these voltages is low enough to be read as a "1" by NAND gate 345, FIG. 6, so the state of the read/write bit does not affect the value of the read-only bit. This may be accomplished in any of several conventional ways. The easiest way is to adjust the physical sizes of the FETs in decoder 34' such that the 2.5-volt level is insufficient to turn them on. Another way is to raise the threshold of these FETs to an intermediate value, say 3.0 volts, which is above the level of the signal from the high side of the cell latch, less the normal-threshold (1.0 volt) drop through an unmodified transfer FET. Bit line B'i, as described above, is not discharged at all through device 113' (threshold 5.0 volts), and thus reports a "0" bit regardless of the value of the read/write bit. In this way, the four possible cell variations 11a–11d are made to represent two bits of read-only data as well as one bit of read/write data.

Figure 7:
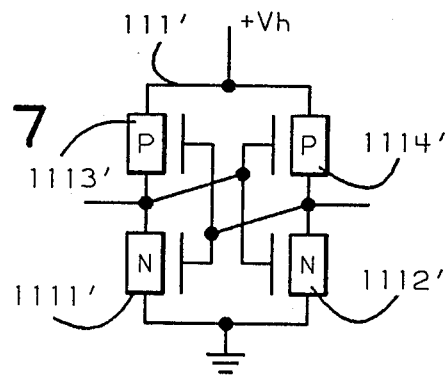
FIG. 7 illustrates an alternative storage-cell latch for the cells of FIGS. 1, 2, 4, and 5.

Many variations are possible within the ambit of the present invention. In particular, many memory units use supply voltages lower then 8.5 volts. At a supply voltage of 5.0, for example, the low (i.e., normal) and high thresholds of transfer devices voltages of transfer FETs such as 112 and 112' might be 1.0 and 3.5 volts; supplies 231 and 234 could be on the order of 5.0 and 3.0 volts, while supplies 41 and 42 could be 5.0 and about 2.5 volts. Different FET technologies can also be used. FIG. 7, for example, shows a cross-coupled cell latch 111' implemented in complementary metal/oxide semiconductor (CMOS), rather than the older NMOS technology. Devices 1111' and 1112' are N-channel FETs, whereas load devices 1113' and 1114' are P-channel FETs. The transfer devices would remain implemented as N-channel FETs.

We claim as our invention:

1. A combined read-only and read/write memory, comprising:
    an array of storage cells, each said storage cell including an FET latch for storing read/write data and at least one transfer FET having source/drain and gate electrodes, the transfer FETs in different ones of storage cells being of first and second physically different types having different first and second threshold voltages for storing read-only data;
    a mode-control line carrying a signal for selecting between a read/write and a read-only mode;
    source means responsive to said mode-control line for selectively supplying a read/write voltage higher than both of said threshold voltages and a read-only voltage intermediate said threshold voltages;
    word selector means including a plurality of individually addressable word lines coupled to respective ones of said transfer-FET gates and to said source means;
    bit selector means including a plurality of bit lines coupled to respective ones of said transfer FETs;
    output means coupled to said bit lines and responsive to said mode-control line for selectively producing read-only and read/write output data from said bit selector means.

2. A memory according to claim 1, further comprising an externally available address bus for selecting data stored in said memory, said address bus having a plurality of parallel lines coupled to said mode-control line, to said word selector means, and to said bit selector means.

3. A memory according to claim 1, wherein said output means includes first and second bit rails and a bit decoder for selecting among pairs of said bit lines, and wherein each of said storage cells includes first and second transfer FETs coupled respectively to first and second bit lines of one of said pairs of bit lines.

4. A memory according to claim 3, wherein said array includes one plurality of said storage cells each having both transfer FETs at said first threshold voltage representing one value of said read-only data, and another plurality of said cells having both transfer FETs at said second threshold voltage representing another value of said read-only data.

5. A memory according to claim 4, wherein said output means includes a logic gate for producing said one value of read-only data only when both of said bit rails carry a first voltage.

6. A memory according to claim 5, wherein said output means is coupled to said mode-control line for producing said one value of read-only data only when said signal selects said read-only data.

7. A memory according to claim 3, comprising a cell voltage source coupled to said latches of each storage cell in said array, and operable to provide a first voltage higher than both of said threshold voltages when said mode-control line signal selects said read/write mode, and to provide a second voltage substantially lower than at least one of said threshold voltages when said signal selects said read-only mode.

8. A memory according to claim 7, comprising a high/low control line for selecting between at least two read-only data bits in the same one of said storage cells.

9. A memory according to claim 8, wherein said output means includes logic gates for producing first and second read-only bits representative of the voltages on said first and second bit rails respectively in response to said high/low control line.

10. A method of accessing read-only data contained in a combined read-only and read/write memory having an array of addressable storage cells each including at least one transfer FET having gate and source/drain electrodes, a first plurality of said transfer FETs being physically constructed so as to have a first threshold voltage and a second plurality of said transfer FETs being physically constructed so as to have a different second threshold voltage, comprising the steps of:
applying a read-only mode signal to said array;
addressing one of said storage cells;
in response to said read-only mode signal, supplying a read-only voltage to the transfer-FET gate electrode of one of said storage cells, said read-only voltage being lower than said first threshold voltage but higher than said second threshold voltage;
sensing a bit-line voltage at said source/drain electrode of one of said storage cells;
producing an output voltage from said bit-line voltage, said output voltage representing said read-only data in said one of said storage cells.

* * * * *